(12) United States Patent
Saint-Laurent

(10) Patent No.: US 7,317,342 B2
(45) Date of Patent: *Jan. 8, 2008

(54) CLOCK DISTRIBUTION NETWORK USING FEEDBACK FOR SKEW COMPENSATION AND JITTER FILTERING

(75) Inventor: Martin Saint-Laurent, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 11/224,820

(22) Filed: Sep. 13, 2005

(65) Prior Publication Data

US 2006/0006918 A1    Jan. 12, 2006

Related U.S. Application Data

(62) Division of application No. 10/125,591, filed on Apr. 19, 2002, now Pat. No. 6,943,610.

(51) Int. Cl.
*G06F 1/04* (2006.01)

(52) U.S. Cl. ............................. 327/295; 713/400

(58) Field of Classification Search ........ 327/291–297; 713/400
See application file for complete search history.

(56) References Cited

U.S. PATENT DOCUMENTS

| | | | |
|---|---|---|---|
| 5,122,679 A | 6/1992 | Ishii et al. ................. 307/269 |
| 5,398,262 A | 3/1995 | Ahuja ......................... 375/356 |
| 5,416,861 A | 5/1995 | Koh et al. .................... 385/14 |
| 5,883,534 A * | 3/1999 | Kondoh et al. ............. 327/156 |
| 5,889,903 A | 3/1999 | Rao ............................ 385/14 |
| 5,923,188 A | 7/1999 | Kametani et al. ............ 326/93 |
| 6,009,532 A | 12/1999 | Self et al. .................. 713/400 |
| 6,177,844 B1 | 1/2001 | Sung et al. .................. 331/25 |
| 6,452,435 B1 | 9/2002 | Skergan et al. ............. 327/293 |
| 6,538,957 B2 * | 3/2003 | Magoshi ..................... 365/233 |
| 6,943,610 B2 | 9/2005 | Saint-Laurent .............. 327/295 |

OTHER PUBLICATIONS

Gutnik, Vadim, et al., "Active GHz Clock Network Using Distributed PLLs", *IEEE Journal of Solid-State Circuits*, vol. 35, No. 11, (Nov. 2000),1553-1560.

* cited by examiner

*Primary Examiner*—Kenneth B. Wells
*Assistant Examiner*—Hai L. Nguyen
(74) *Attorney, Agent, or Firm*—Schwegman, Lundberg & Woessner, P.A.

(57) ABSTRACT

A clock distribution network for clock distribution in an integrated circuit (IC) using digital feedback for skew compensation and jitter filtering. In an embodiment, a number of clock processor nodes are distributed throughout the clock distribution network on the IC at respective local clock regions. A master clock generator generates a master clock for distribution to the clock processor nodes, via the clock distribution network, to compensate clock skew and filter clock jitter locally at the respective local clock regions.

11 Claims, 12 Drawing Sheets ical operations. A clock
CLOCK DISTRIBUTION NETWORK USING FEEDBACK FOR SKEW COMPENSATION AND JITTER FILTERING This application is a Divisional of U.S. application Ser. No. 10/125,591 filed on Apr. 19, 2002 now U.S. Pat. No. 6,943,610 which incorporated herein by reference.

FIELD

The present invention relates generally to clock distribution in integrated circuits (ICs) and, more specifically, relates to a clock distribution network for clock distribution in an integrated circuit (IC) using digital feedback for skew compensation and jitter filtering.

BACKGROUND

High-performance and very large scale integration chips such as microprocessors, chipsets, system on-chips, application specific integrated circuits (ASICs) and digital signal processing (DSP) systems, are typically provided with a large number of sequential elements that perform various logic functions, such as mathematic operations. A clock signal, known as a "global" clock signal, may be used as a timing reference to synchronize data or logic operations performed by these elements positioned at different locations (points), or destinations, on the chip.

A major challenge in such circuit designs is to distribute a "global" clock signal to the elements through different interconnect segments across the chip with minimal clock inaccuracy, particularly when the operating frequency of the chip and the frequency of the "global" clock signal are high. Clock inaccuracy often results in one clock edge not arriving at a sampling point on the chip at its nominal time, measured relative to another clock edge. One type of clock inaccuracy is commonly referred to as clock "skew". Clock "skew" within a chip is the difference in time that the "global" clock signal reaches different locations (points) on the chip. There are a number of factors for causing clock "skew", including, for example, electromagnetic propagation delays, buffer delays in the distribution network, resistive-capacitive (RC) delays associated with various distribution lines in the distribution network, and variations in the manufacturing process, temperature gradients, power supply and load capacitance. Another type of clock inaccuracy is referred to as clock "jitter". Clock "jitter" is the distortion in clock cycle and phase difference accumulated over time (distance), and can be exacerbated by variations caused by noise.

Conventional clock distribution networks typically employ tree-based topology networks, grid-based topology networks, or specific combinations of trees and grids for clock distribution. Many conventional clock distribution networks are designed and implemented specifically for either centralized or distributed skew compensation, while a few active clock distribution networks are currently proposed by academic researchers using multiple oscillators for either centralized or distributed jitter filtering operation.

Clock distribution networks with centralized skew compensation strategies usually rely on a centralized controller (skew compensator) to ensure that clock pulses sent to every clock region on the chip arrive at the expected time. However, distortion can occur, given the wire lengths or relatively long distances between the skew compensator and different clock regions on the chip. A more practical alternative to clock distribution networks with centralized skew compensation is distributed skew compensation in which clock "skew" is compensated at each clock region on the chip.

Similarly, clock distribution networks with centralized jitter filtering strategies rely on a single centralized attenuation filter to filter the jitter accumulation from multiple individual oscillators. The phase signals generated by the individual oscillators are averaged to produce the clock delivered to the sequential elements on the chip. However, noise can propagate, given the wire lengths or relatively long distances between the attenuation filter and different oscillators at different clock regions on the chip. An alternative to centralized jitter filtering is the use of multiple filters distributed at different clock regions for jitter attenuation.

Both types of clock distribution networks rely on analog feedback mechanisms for either centralized or distributed jitter filtering. As a result, clock distribution networks for either centralized or distributed jitter filtering suffer from a large number of significant practical shortcomings. For example, the clock distribution networks are very complex and difficult to implement in practice, sensitive to noise and distortion caused by the transmission of feedback signals over relatively long distances to synchronize the oscillators, susceptible to mode-locking (i.e., an undesirable stable equilibrium in which not all the oscillators have the same phase), and are incompatible with established design-for-testability (DFT) and design-for-debugability (DFD) techniques.

A recent clock distribution network design that incorporates both the clock skew compensation and jitter filtering strategies is disclosed by V. Gutnik, and A. P. Chandrakasan, "Active GHz Clock Network Using Distributed PLLs", *IEEE Journal of Solid-State Circuits*, November 2000, pp. 1553-1560. According to Gutnik, a multi-PLL distribution network is provided with an array of synchronized phase-locked loops (PLLs) at multiple locations (points) across the chip. Each PLL feeds a local clock region, and phase detectors (PDs) are inserted between adjacent clock regions for analog feedback and clock alignment. However, the multi-PLL distribution network as described by Gutnik does not distribute individual clock pulses and is not compatible with established design-for-testability (DFT) and design-for-debugability (DFD) techniques.

Therefore, a need exists for a new clock distribution network for clock distribution in an IC chip implemented for both skew compensation and jitter filtering that are compatible with established design-for-testability (DFT) and design-for-debugability (DFD) techniques.

BRIEF DESCRIPTION OF THE DRAWING(S)

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

Figure 14A:
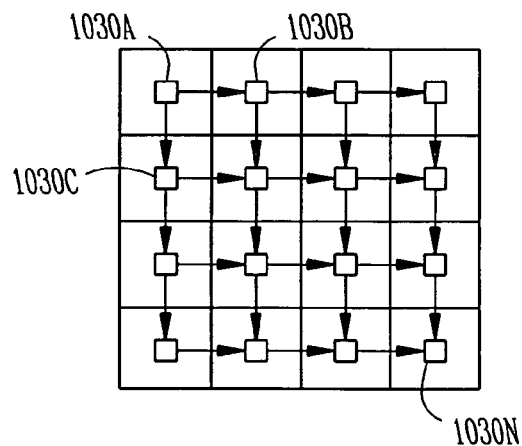
Figure 14B:
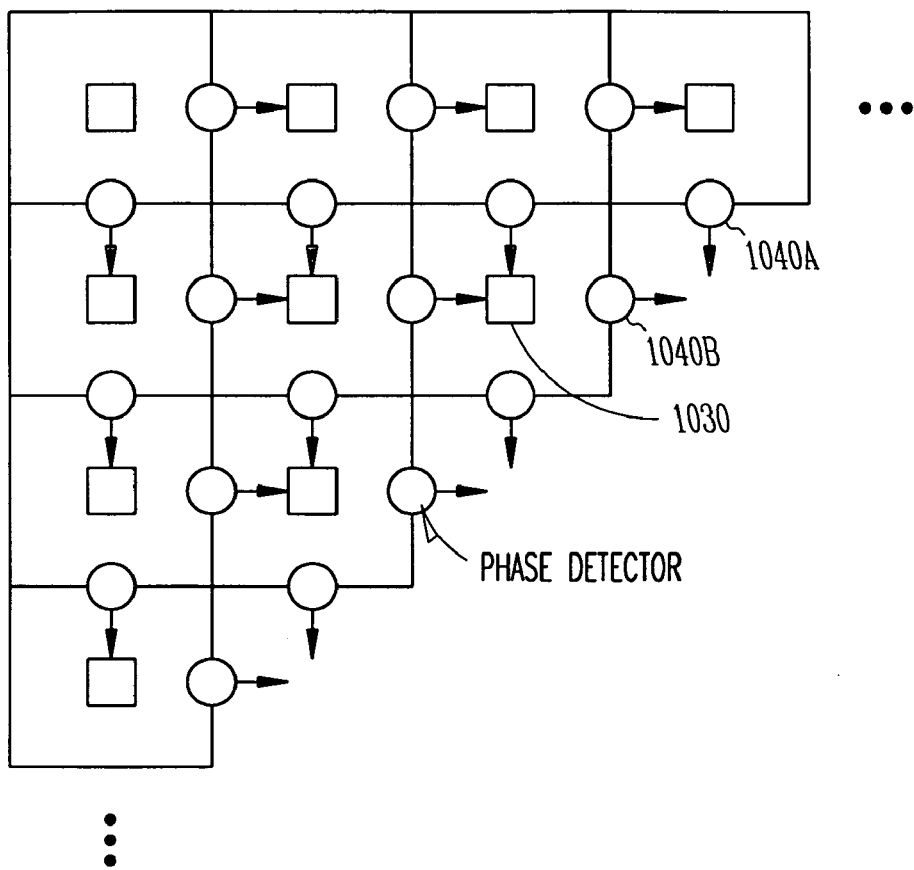
Figure 14C:
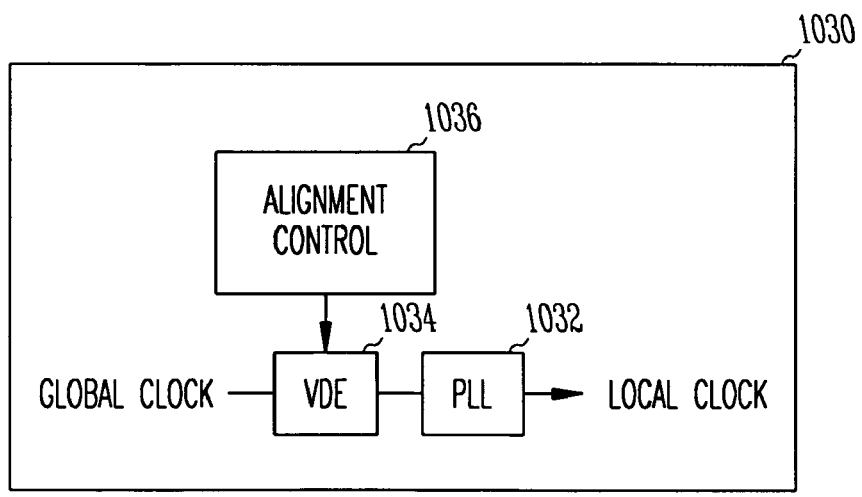
Figure 15:
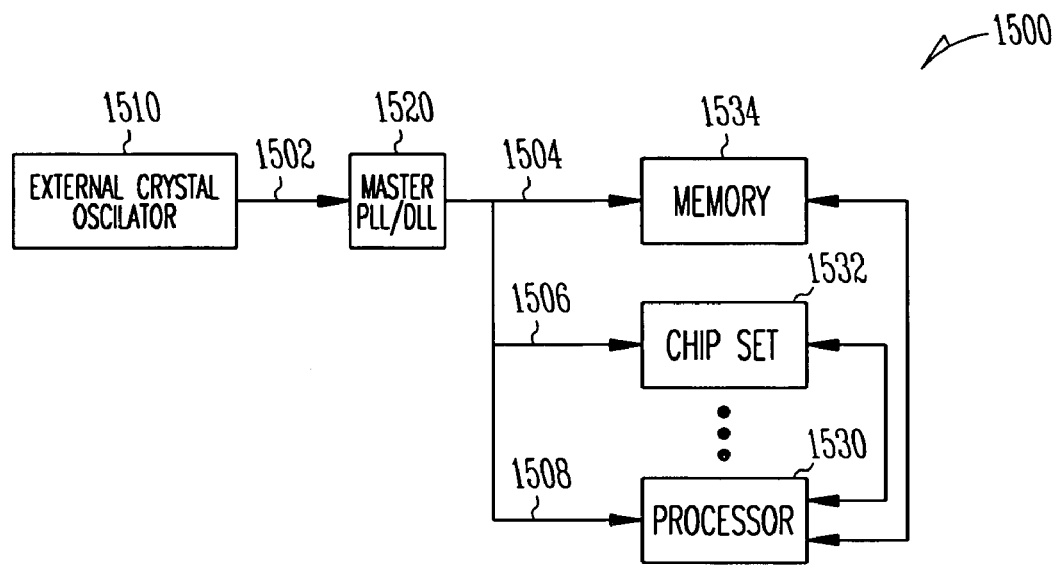
Figure 16:
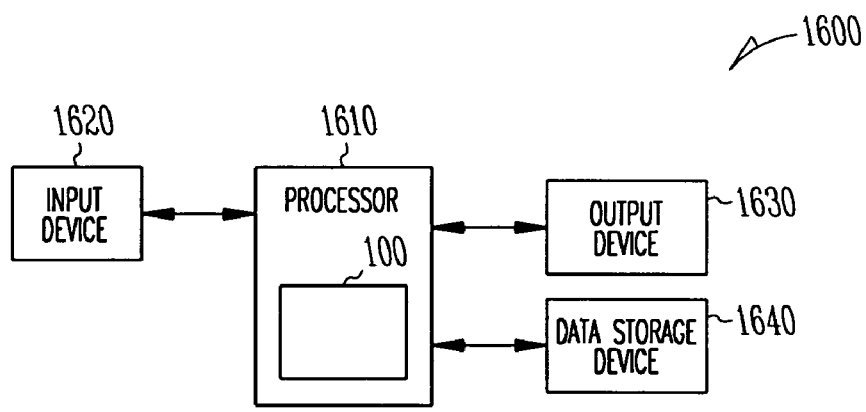

FIGS. 14A-14C illustrate an example unidirectional propagation of phase alignment information propagation according to an example embodiment of the present invention; and FIG. 15 illustrates an example computer system including an example clock distribution network according to an example embodiment of the present invention; and FIG. 16 illustrates an example computer system including an example clock distribution network according to another example embodiment of the present invention.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges may be given, although the present invention is not limited to the same. As manufacturing techniques (e.g., photolithography) mature over time, it is expected that IC chips of smaller size can be manufactured. In addition, well known power/ground connections to IC chips and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details.

Various example embodiments of the present invention are applicable for use with all types of semiconductor IC chips, including, but not limited to, high-frequency microprocessors, chipsets, system on-chips, application specific integrated circuits (ASICs), digital signal processing (DSP) systems and other types of programmable logic arrays or devices that need a clock signal for distribution to multiple elements on a single chip or multiple chips in a package, such as, for example, a system having a plurality of dice including a microprocessor in communication with other dice including chipset and memory devices.

Figure 1:
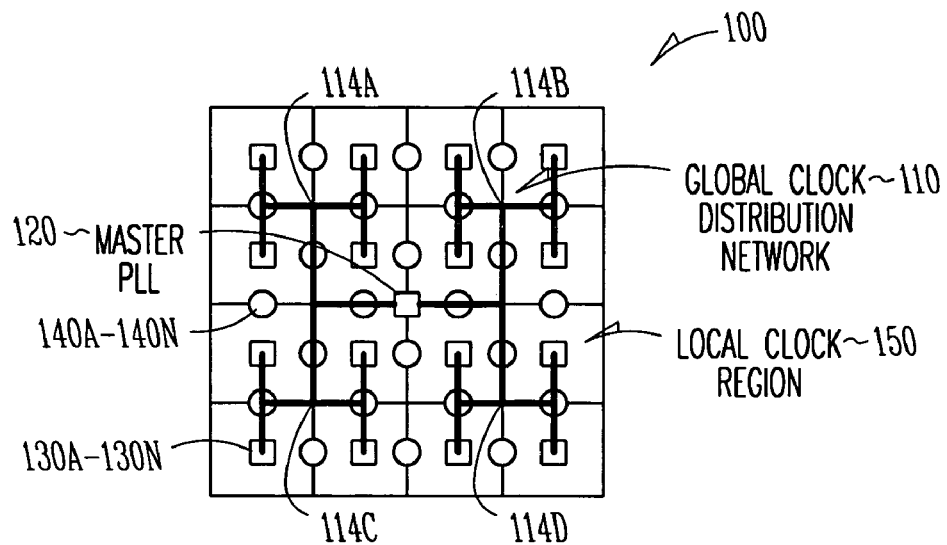
FIG. 1 illustrates a semi-distributed architecture for an example clock distribution network according to an example embodiment of the present invention.

Attention now is directed to the drawings and particularly to FIG. 1, in which a semi-distributed architecture for clock distribution according to an embodiment of the present invention is illustrated. As shown in FIG. 1, the semi-distributed architecture 100 utilizes a global clock distribution network 110 driven by a single clock generator/synchronizer in the form of a master phase-locked loop (PLL) 120 to feed an array of slave PLLs kept synchronized using variable-delay elements (VDEs) at respective peripheral clock processor nodes 130A-130N (where N refers to any number of peripheral nodes in the global clock distribution network 110) distributed throughout the area of an IC die.

The global clock distribution network 110 includes, but is not limited to, any tree-based clock distribution network, any grid-based clock distribution network, or any specific combination of trees and grids with tunable tree and grid network for clock distribution to multiple elements on a single chip or multiple chips in a package, via wires. However, for purposes of illustration, the global clock distribution network 110 may correspond to an equal length clock distribution network such as a multiple-level H-Tree network in which a global clock signal generated from the master PLL 120 at a center (clock synchronizer) node is routed to each of peripheral receiver nodes on the chip, i.e., peripheral clock processor nodes 130A-130N of the H-tree network 110, via intermediate nodes 114A-114D. Every intermediate node 114A-114D may be an equal distance from center node. Every peripheral node, i.e., clock processor node 130A-130N, may be an equal distance from its respective intermediate node 114A-114D. As a result, the clock paths to all of the peripheral clock processor nodes 130A-130N are an equal distance from the master PLL 120 at the center node 112, and the clock delay from the master PLL 120 at the center node is equal to all peripheral clock processor nodes 130-130N of the H-tree network 110. Thus, each clock processor node 130A-130N can be configured to act as a receiving station for clock signal and service clocking requirements of sequential elements in a local clock region 150 (i.e., an area of the chip near the node) with negligible clock skew with reference to the other similarly configured nodes of the H-tree network 110.

The master PLL 120 may be used to generate a "global" clock signal of a high-frequency from a system clock of a low-frequency and to maintain synchronization between the global clock signal and the system clock. The master PLL 120 may then transport the global clock signal to each PLL in the array at respective peripheral clock processor nodes 130A-130N, via the clock distribution network 110, for subsequent clock skew compensation and jitter filtering. The PLLs at peripheral clock processor nodes 130A-130N may be known as slave PLLs.

Figure 2:
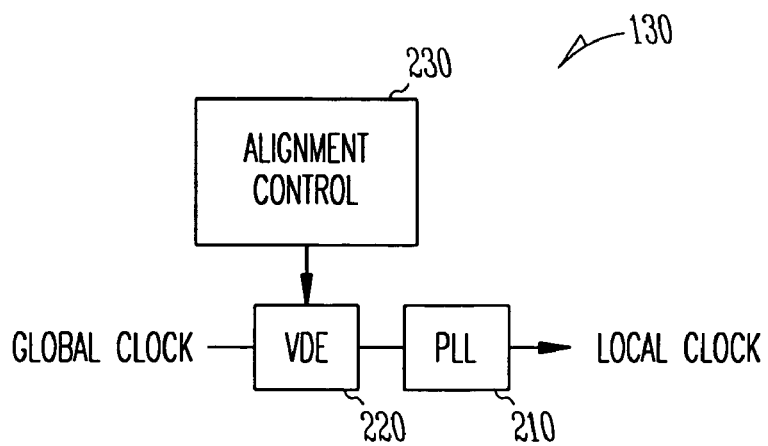
FIG. 2 illustrates an example clock processor node of the clock distribution network shown in FIG. 1.

Each clock processor node 130A-130N may be used to compensate clock "skew" and filter clock "jitter" locally at each local clock region 150. As shown in FIG. 2, each clock processor node 130A-130N may comprise a slave PLL 210, a variable-delay element 220 and an alignment control unit 230. The slave PLL 210 may be used to attenuate the clock jitter from the global clock signal introduced by the global clock distribution network 110. The variable-delay element (VDE) 220 may be inserted before each slave PLL 210 at a respective clock processor node 130A-130N to compensate delay variations (i.e., clock skew) experienced by the global clock signal, when the global clock signal travels toward the clock processor nodes 130A-130N. The alignment control unit 230 may be used to control the VDE 220 to align the global clock signal (i.e., phase alignment) for clock skew compensation. Since the phase correction loop of each slave PLL 210 is local at a particular clock region 150, the slave PLL 210 may be significantly less sensitive to supply voltage drops and to capacitive and inductive coupling noise. As a result, the slave PLLs 210 of the respective clock processor nodes 130A-130N can be designed more easily and characterized independently from the rest of the clock distribution network 110 since feedback is entirely internal.

Phase detectors (PD) 140A-140N (where N refers to any number of adjacent local clock regions in the global clock distribution network 110) may be arranged between adjacent local clock regions 150 to ensure that the clock produced by each slave PLL 210 (i.e., local clock signal) is aligned with the clock of its neighbors. When at least one phase detector (PD) 140A-140N determines that the local clock signal at a particular local clock region 150 may be too fast or too slow, a digital signal may be generated and returned to a corresponding clock processor node 130A-130N controlling the particular local clock region 150 for clock delay adjustment and clock synchronization.

Figure 3:
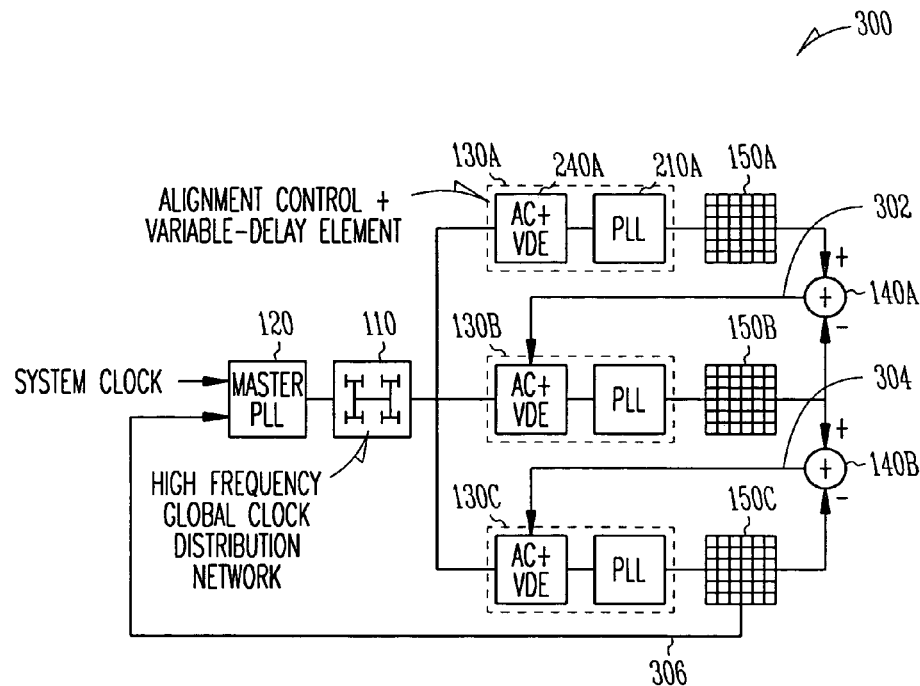
FIG. 3 illustrates an example feedback mechanism for clock skew compensation and jitter filtering of the clock distribution network shown in FIG. 1.

FIG. 3 illustrates an example feedback mechanism 300 for clock skew compensation and jitter filtering of the clock distribution network shown in FIG. 1. For the sake of simplicity, only a selected number of peripheral clock processor nodes and local clock regions are described along with corresponding phase detectors (PD). In actual implementation, there are as many peripheral clock processor nodes as there are local clock regions in the entire clock distribution network.

As shown in FIG. 3, the peripheral clock processor nodes 130A-130C are coupled to receive the global clock signal from the master PLL 120 through a high-frequency global clock distribution network 110 for clock skew compensation and jitter filtering at local clock regions 150A-150C. The clock processor node 130A may include, for example, a slave PLL 210A arranged to filter the jitter from the global clock signal, and an alignment control/variable-delay element (AC/VDE) 240A arranged to compensate clock skew from the global clock signal. Similarly, the clock processor node 130B may include a slave PLL 210B arranged to filter clock jitter from the global clock signal, and an alignment control/variable-delay element (AC/VDE) 240B arranged to compensate clock skew from the global clock signal. Likewise, the clock processor node 130C may include a slave PLL 210C arranged to filter clock jitter from the global clock signal and generate a local clock signal, and an alignment control/variable-delay element (AC/VDE) 240C arranged to compensate clock skew from the global clock signal. For the sake of brevity, the alignment control/variable-delay element (AC/VDE) 240A-240A is shown as a single integrated element. In actuality, however, the alignment control/variable-delay element (AC/VDE) 240A-240A contains a variable-delay element 220 and an alignment control unit 230 as described with reference to FIG. 2.

The local clock signal generated from each of the slave PLLs 210A-2101B may be distributed from the respective local clock regions 150A-150C using any known clock distribution strategy. In addition, the local clock signal from one local clock region may be compared to the local clock signal from the neighboring local clock regions.

For example, a first phase detector (PD) 140A may be coupled to receive the local clock signal "A" from the clock processor node 130A at the local clock region 150A and the local clock signal "B" from the clock processor node 130B at the local clock region 150B, and generate a digital output indicating the sign of the phase difference (e.g., phase difference can be negative or positive) between the local clock signal "A" and the local clock signal "B" for feedback to the AC/VDE 240B of the clock processor node 130B, via feedback line 302, for phase adjustments. Similarly, a second phase detector (PD) 140B may be coupled to receive the local clock signal "B" from the clock processor node 130B at the local clock region 150B and the local clock signal "C" from the clock processor node 130C at the local clock region 150C, and generate a digital output indicating the sign of the phase difference between the local clock signal "B" and the local clock signal "C" for feedback to the AC/VDE 240C of the clock processor node 130C, via feedback line 304, for phase adjustments.

At any local clock region in the entire clock distribution network 110, for example, the local clock region 150C as shown in FIG. 3, the local clock signal from the local clock region 150C may be returned to the master PLL 120 for master clock phase alignments, via feedback line 306.

Since the feedback to the AC/VDE 240A-240C from the phase detectors 140A-140C is digital, the local clock signal of the local clock region 150A-150B can be easily gated to save power without compromising the stability of the entire clock distribution network 110. The variable-delay element of each alignment control/variable-delay element (AC/VDE) 240A-240C can determine how to adjust its delay based on the alignment control, and compensate any undesired delay variation experienced by the local clock signal when the local clock signal reaches the respective clock processor node 130A-130C.

Digital synchronization has a number of advantages over analog synchronization. For example, digital feedback signals are significantly less sensitive to noise and, unlike analog signals, can be routed without taking special precautions. In addition, digital feedback signals advantageously enable the synchronization mechanism for the slave PLLs at the peripheral clock processor nodes 130A-130N to be flexible and more robust while providing greater stability.

As described with reference to FIGS. 1-3, the semi-distributed architecture for clock distribution according to an embodiment of the present invention advantageously provides both clock skew compensation and jitter filtering, while remaining compatible with the testability and debugability requirements of established design-for-testability (DFT) and design-for-debugability (DFD) techniques. For example, clock skew compensation may be performed by way of variable-delay elements (VDEs) and alignment control. Jitter filtering may be performed by way of the PLLs in an array. In addition, established DFT and DFD techniques require the ability of the clock distribution network to bypass the clock normally delivered to the sequential elements across the chip, to stop and restart the clock delivered to the sequential elements such as that the sequential elements can be controlled step by step which is useful for array updates. Furthermore, the established DFT and DFD techniques also require the ability to change the duty cycle or, more generally, to move the edges of the clock delivered to the sequential element which is useful for debugging purposes. The semi-distributed architecture for clock distribution according to an example embodiment of the present invention, as shown in FIGS. 1-3, supports the established DFT and DFD requirements since the master PLL 120 and the slave PLLs 210 at peripheral clock processor nodes 130A-130N can be bypassed, so that the sequential elements can be controlled step by step. Furthermore, the duty cycle of the clock can be adjusted, and intentional skew can be introduced since the variable-delay elements (VDEs) are digitally controllable.

Figure 4:
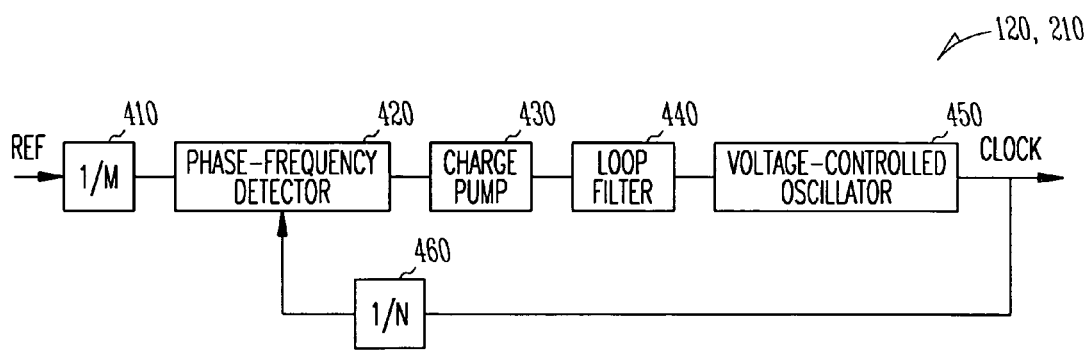
FIG. 4 illustrates a circuit schematic of an example phase-locked loop (PLL) according to an example embodiment of the present invention.

FIG. 4 illustrates a circuit schematic of an example phase-locked loop (PLL) according to an example embodiment of the present invention. The PLL shown in FIG. 4, may serve as a master PLL 120 arranged to receive an incoming clock (i.e., system clock signal) and generate an output clock (i.e., global clock signal) which is subsequently fed back in a global feedback loop in order to ensure that the output clock is synchronized or aligned with the input clock. However, the PLL shown in FIG. 4 may also serve as an individual slave PLL 210A-210C arranged to receive an incoming clock (i.e., global clock signal) and generate an output clock (i.e., local clock signal) which is subsequently fed back in a local feedback loop in order to ensure that the output clock is synchronized or aligned with the input clock. If the PLL shown in FIG. 4, serves as a master PLL 120, then the feedback may be returned from the last or any local clock region in the entire clock distribution network as shown in FIG. 3. Alternatively, if the PLL shown in FIG. 4, serves as an individual slave PLL 210A-210C, then the feedback may be returned locally within each PLL so as to minimize noise, typically associated with feedback signals, via wires distributed throughout different areas of the IC chip.

In both example implementations, the PLL 120/210 shown in FIG. 4, may comprise a first divider 410 arranged to receive a reference clock (i.e., system clock signal or global clock signal); and a feedback circuit which includes a phase-frequency detector 420, a charge pump 430, a loop filter 440, a voltage-controlled oscillator 450, and a second divider 460 for providing local feedback to the phase-frequency detector 420 within the PLL (120/210), and reducing phase jitter at each clock distribution nodes. Both the master PLL 120 and the slave PLLs 210A-210C may operate as an input buffer for achieving zero skew between the reference clock and the output clock (local clock signal) that drives the internal logic gates of the IC chip.

The first divider 410 may be programmable and may contain a division factor "1/M" where M is an integer equal or greater than "1". Similarly, the second divider 460 may be programmable and may contain a division factor "1/N" where N is also an integer equal or greater than "1". Both M and N may be selected based on a frequency of the output clock that needs to be generated for more than one clock speed. The use of multiple programmable dividers 410 and 460 allows the flexibility to make the frequency of the output clock equal to (N/M) the frequency of the reference clock (where N and M are integer $\geq 1$).

The phase-detector 420 may compare the frequency of the reference clock and the frequency of the output clock (i.e., feedback clock that has been divided by N via the second divider 460) and produce an output that is proportional to the frequency difference (or phase difference) of the reference clock and the output clock, and that is used to control the charge pump 430 to compensate for any undesired delay variation experienced by the output clock generated from the voltage-controlled oscillator (VCO) 450 and returned through the 1/N divider 460.

The loop filter 440 may be used to smooth out and filter the clock (phase) jitter from the output clock generated from the voltage-controlled oscillator (VCO) 450 and returned through the 1/N divider 460. The voltage-controlled oscillator (VCO) 450 may finally generate an output clock that has been phase-corrected and jitter-filtered.

Figure 5:
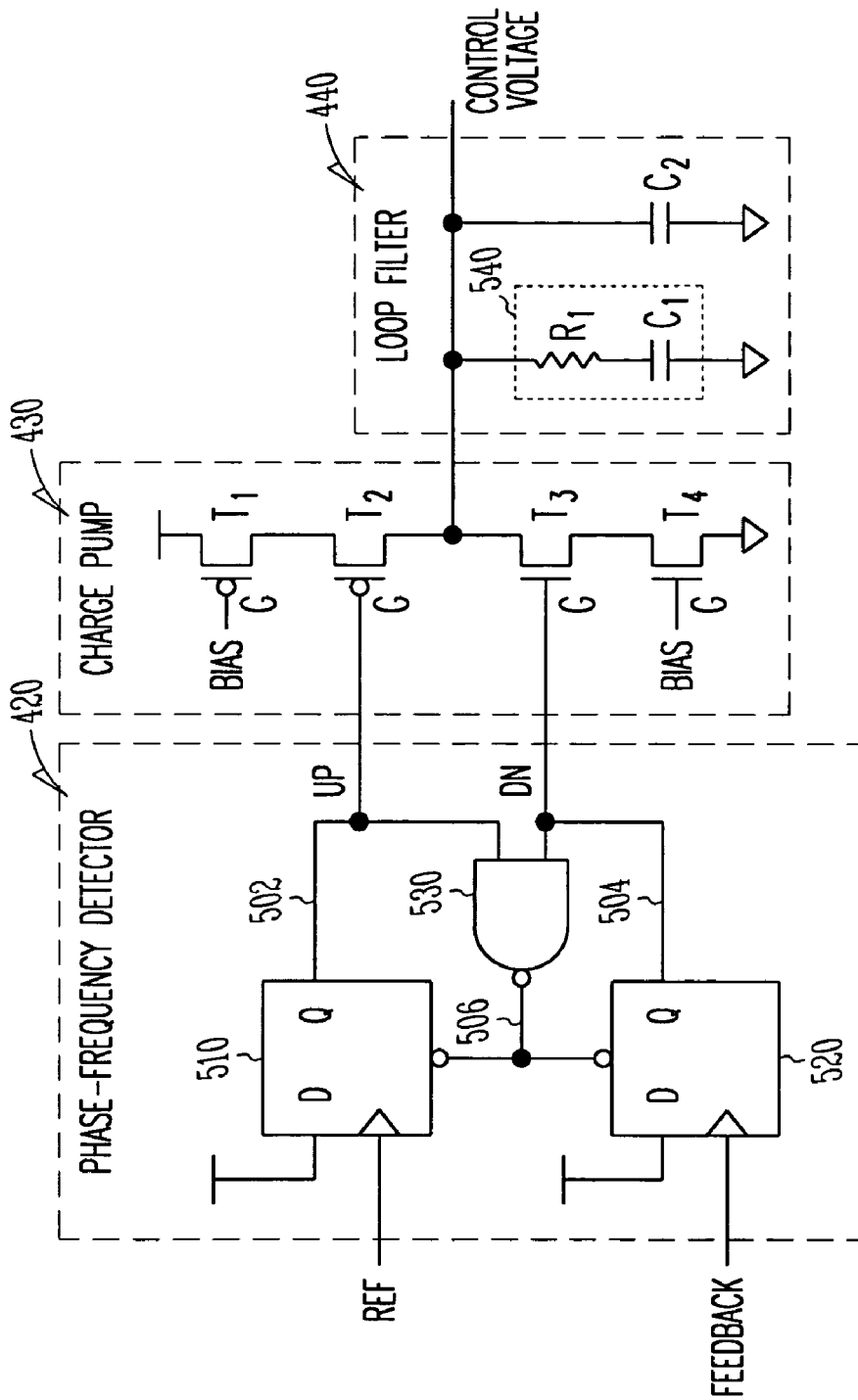
FIG. 5 illustrates a circuit schematic of an example phase-frequency detector, an example charge pump and an example loop filter of the phase-locked loop (PLL) according to an example embodiment of the present invention.

FIG. 5 illustrates an example phase-frequency detector 420, an example charge pump 430 and an example loop filter 440 of the phase-locked loop (PLL) shown in FIG. 4. The circuit diagrams of the phase-frequency detector 420, the charge pump 430 and the loop filter 440 are simply example embodiments of the present invention and, therefore, are not limited thereto. Other logic circuits may be utilized to construct the phase-frequency detector 420, the charge pump 430 and the loop filter 440.

As shown in FIG. 5, the example phase-frequency detector 420 may comprise master-slave flip-flops 510 and 520, and a logic gate such as a NAND gate 530 arranged to compare the frequency of the reference clock and the frequency of the output clock, and produce an output to the charge pump 430. The master-slave flip-flops 510 and 520 are delay (D) flip-flops. The first D flip-flop 510 has a data (D) terminal coupled to receive input data, a clock (CK) terminal coupled to receive the reference clock, and an output (Q) terminal to generate a logic output at line 502. Likewise, the second D flip-flop 520 has a data (D) terminal coupled to receive input data, a clock (CK) terminal coupled to receive the feedback clock, and an output (Q) terminal to generate a logic output at line 504. The NAND gate 530 may be arranged to logically combine the logic output from line 502 and the logic output from line 504 and generate a control signal at line 506 to control the operation of the D flip-flops 510 and 520.

The example charge pump 430 may comprise transistors T1, T2, T3 and T4 arranged in series between a power supply terminal and a ground terminal to produce a control voltage so as to control (i.e., increase or decrease) the charge stored in the example loop filter 440. The transistors T1 and T2 are p-channel field-effect transistors (P-FETs), and the transistors T3 and T4 are n-channel field-effect transistors (N-FETs). Each of the P-FET T1 and N-FET T4 has a gate electrode coupled to a bias voltage. Each of the P-FET T2 and N-FET T3 has a gate electrode coupled to receive the logic output at line 502 and line 504 from the example phase-frequency detector 420, and a drain electrode coupled to an output terminal at line 508 to produce the control voltage for the voltage-controlled oscillator 450.

The example loop filter 440 may comprise a RC circuit 540 which includes a resistor R and a capacitor C1 arranged in series, and a fairly small gate capacitor C2 which is arranged in parallel with the RC circuit 540 coupled to filter noise and jitter from the control voltage at line 508.

Figure 6:
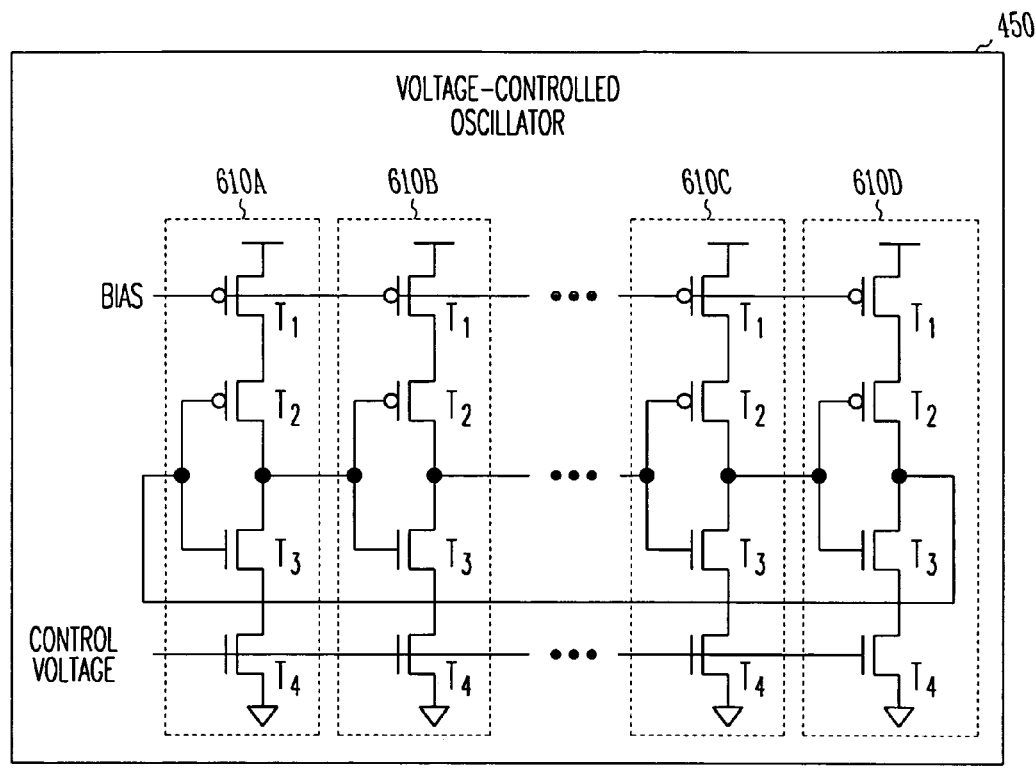
FIG. 6 illustrates a circuit schematic of an example voltage-controlled oscillator (VCO) according to an example embodiment of the present invention.

Turning now to FIG. 6, an example voltage-controlled oscillator (VCO) 450 of the PLL shown in FIG. 4 is illustrated. The example voltage-controlled oscillator (VCO) 450 may comprise a cascade of current-starved inverters 610A-610N arranged to generate an output clock that has been phase-corrected and jitter-filtered based on the control voltage. Each of the current-starved inverters 610A-610N may comprise transistors T1, T2, T3 and T4 arranged in series between a power supply terminal and a ground terminal and coupled to receive the bias voltage and the control voltage to produce the final output clock. In each current-starved inverters 610A-610N, transistors T1 and T2 are p-channel field-effect transistors (P-FETs), and transistors T3 and T4 are n-channel field-effect transistors (N-FETs). Each P-FET T1 has a gate electrode coupled to receive the bias voltage, and each N-FET T4 has a gate electrode coupled to receive the control voltage. The P-FET T2 and N-FET T3 each has a gate electrode connected together in series, and a drain electrode coupled to an output terminal to produce the final output clock.

Figure 7A:
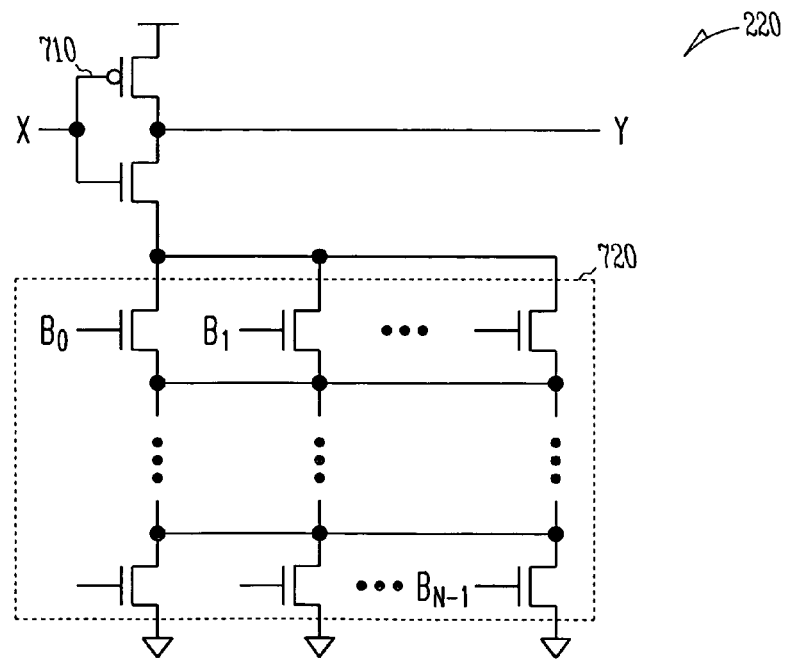
FIGS. 7A-7B illustrate a circuit schematic of an example variable-delay element (VDE) according to various example embodiments of the present invention.
Figure 7B:
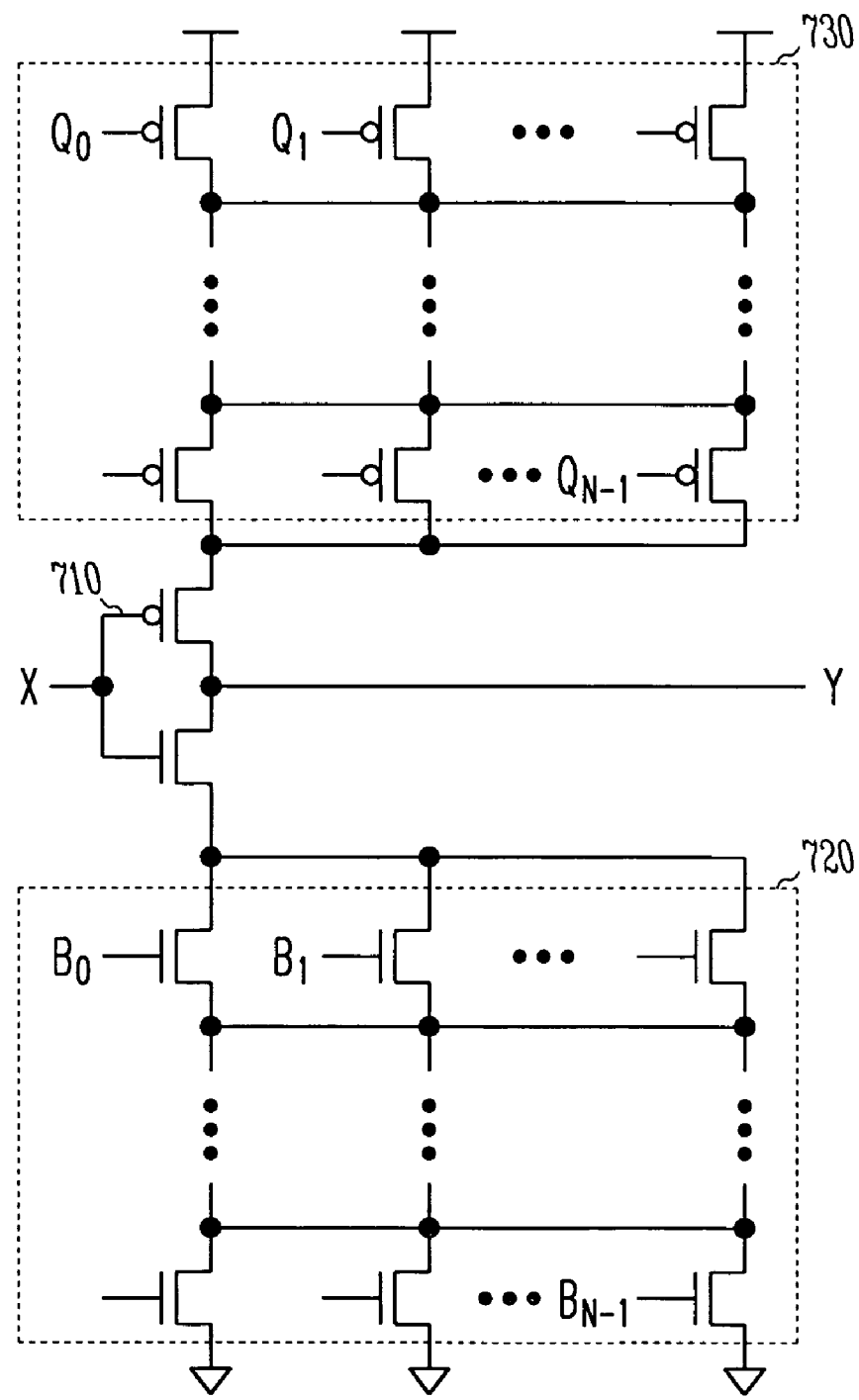

FIGS. 7A-7B illustrate a circuit schematic of an example variable-delay element (VDE) 220 of the semi-distributed architecture for clock distribution as shown in FIGS. 1-3. As previously discussed with reference to FIGS. 1-3, the variable-delay element (VDE) 220 at each clock processor node 130A-130N distributed throughout the areas of the IC chip is inserted before each slave PLL 210A-210N, and is used to compensate clock skew. As shown in FIGS. 7A-7B, the variable-delay element (VDE) 220 may form, but not limited thereto, at least two example digitally adjustable resistor embodiments according to the present invention.

In one example embodiment shown in FIG. 7A, the variable-delay element (VDE) 220 may be constructed using an inverter 710 and a pull-down stack using a plurality of transistors provided in a transistor array 720. The inverter 710 may be arranged to receive an input clock "x" (i.e., global clock signal) and to produce an output "y" (i.e., reference clock) with delay variations to the slave PLL 210A-210N. The transistor array 720 may contain rows and columns of transistors in which multiple rows are allowed. Individual transistors in the transistor array 720 may be p-channel field-effect transistors (P-FETs) or n-channel field-effect transistors (N-FETs). The transistor array 720 may form a digitally adjustable resistor that can be controlled with a control signal exhibiting a considerably wider range of alignment control bits ($b_0, b_1 \ldots b_{n-1}$) provided from the alignment control unit 230 shown in FIG. 2. Each bit of the control signal b[n−1:0] may be connected to the gate of each transistor in the transistor array 720.

It should be appreciated that all the control bits for a particular row shown in FIG. 7 cannot be simultaneously zero to guarantee that the output can switch. In these embodiments, every control bit combination that blocks the pull-down stack may be considered illegal. The resistance of the pull-down stack may be minimal when the transistors of the transistor array 720 are conducting. The maximum resistance may be achieved when, for each row, only the smallest transistor in the transistor array 720 conducts. As a result, the transistor array 720 can produce a wide range of resistance values, even when its number of transistors is relatively small. This is because the transistors widths may be chosen such that resistance values are fairly evenly distributed between their minimum $R_{min}$ and maximum $R_{max}$, and the control bit combinations may be selected such that a particular resistance value is obtained.

In particular, the widths of the transistors in the transistor array 720 may be randomly selected to produce a set of resistance values for the transistor array 720 forming the digitally adjustable resistor. Likewise, the control bits to be applied to the gate of each transistor in the transistor array 720 may be selected to produce a desired resistance value. Each set of control bits may be used to determine which transistors are ON and which transistors are OFF. In other words, each set of control bits defines a particular combination of transistors in parallel and in series. The control bit combinations can be selected under nominal conditions and under conditions subjected to random process, voltage and temperature variations in the transistor array 720.

In another example embodiment shown in FIG. 7B, the variable-delay element (VDE) 220 may be constructed using an inverter 710, a pull-down stack using a plurality of transistors provided in a transistor array 720, and a pull-up stack using a plurality of transistors provided in a transistor array 730. As shown in FIG. 7B, the inverter 710 may be arranged to receive an input clock "x" (i.e., global clock signal) and to produce an output clock "y" (i.e., reference clock) to the slave PLL 210A-210N. The transistor array 720 of the pull-down stack and the transistor array 730 of the pull-up stack both contain rows and columns of transistors in which multiple rows may be accessed. Each of the transistor arrays 720 and 730 forms a digitally adjustable resistor. Each bit of the control signal b[n−1:0] may be connected to the gate of one of the transistors in the transistor array 720, while each bit of the control signal q[n−1:0] may be connected to the gate of one of the transistors in the transistor array 730. Similarly to the example embodiment shown in FIG. 7A, the widths of the transistors in both the transistor array 720 and the transistor array 730 may be randomly selected to produce a set of resistance values for the digitally adjustable resistor. Likewise, the control bits to be applied to the gate of each transistor in both the transistor array 720 and the transistor array 730 may be selected to produce a desired resistance value.

In both example embodiments as shown in FIGS. 7A-7B, the variable-delay element (VDE) 220 forming a digitally adjustable resistor may also be suitable for high-frequency microprocessor debugging purposes, and provide more flexibility and more robust against random channel length variations since its area and power dissipation are relatively small.

Figure 8A:
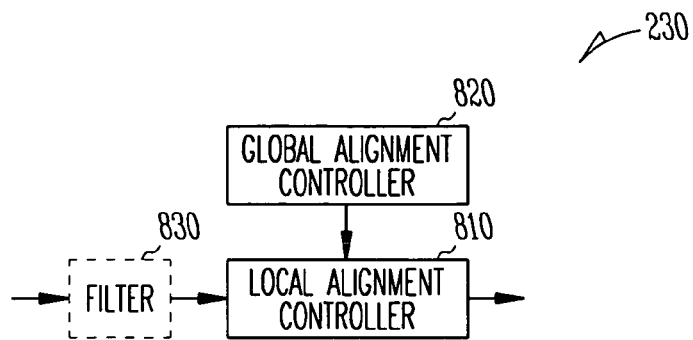
FIGS. 8A-8B illustrate a circuit schematic of an example alignment control unit according to various example embodiments of the present invention.
Figure 8B:
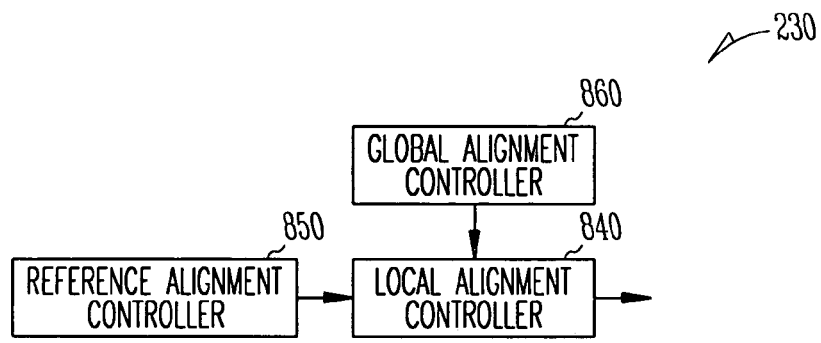

FIGS. 8A-8B illustrate a block diagram of an example alignment control unit 230 of the semi-distributed architecture for clock distribution according to example embodiments of the present invention. As previously discussed with reference to FIGS. 1-3 and FIGS. 7A-7B, the alignment control unit 230 may be used to control the respective variable-delay element (VDE) 220 at each clock processor node 130A-130N in order to align an input clock (i.e., global clock signal) with an output clock (i.e., local clock signal). Collectively, there are at least two clock alignment algorithms that can be employed by the alignment control unit 230 to keep the slave PLLs 210A-210C phase-locked and aligned, including, a spinning wheel phase alignment algorithm and a range sharing phase alignment algorithm. For example, the spinning wheel phase alignment algorithm may be activated and started with a local clock produced by a slave PLL located at a designated processor node of the IC chip serving as a reference PLL. The idea is to propagate its phase along the main diagonal of the IC chip in a spinning wheel fashion until all other slave PLLs have the same phase. Similarly, the range sharing phase alignment algorithm may be activated and started with a local clock produced by the slave PLL located at a designated processor node of the IC chip serving as a reference PLL. Its phase is still propagated along the main diagonal of the IC chip. However, if a variable-delay element within the respective clock processor node reaches its delay limits, a return signal may be sent back to the reference PLL. The reference PLL can then try to share the range of its variable-delay element with the out-of-range PLL.

As shown in FIG. 8A, an example alignment control unit 230 implemented with a spinning wheel phase alignment algorithm may include a local alignment controller 810 arranged locally at each clock processor node 130A-130N for managing a variable-delay element (VDE) 220 (see FIG. 2), and a global alignment controller 810 arranged globally for all clock processor nodes 130A-130N for managing all the local alignment controllers 810, including when to start and restart the alignment process in order to ensure that the alignment process correctly proceeds along the main diagonal of the IC chip. Each local alignment controller 810 may receive one or two digital phase error signals returned from the respective local clock region 150 (see FIG. 1) and determine if the delay of the variable-delay element (VDE) 220 at the respective clock processor nodes 130A-130N is to be increased or decreased. Optionally, a digital filter 830 may be used to filter noise associated with the phase error signals before the filtered signals can be used to determine the delay of the respective variable-delay element (VDE) 220.

As shown in FIG. 8B, an example alignment control unit 230 implemented with a range sharing alignment algorithm may include a local alignment controller 840 arranged locally at each clock processor node 130A-130N for managing a variable-delay element (VDE) 220 (see FIG. 2), and a reference alignment controller 850 arranged at a designated clock processor node 130A-130N to decide how to manage requests for phase adjustment coming from the downstream slave PLLs. A global alignment controller 860 may then be arranged globally for all clock processor nodes 130A-130N for managing all the local alignment controllers 810, including when to start and restart the alignment process as well as to handle the out-of-range conditions that the local controllers 840 may signal. Each local alignment controller 840 may also receive one or two digital phase error signals returned from the respective local clock region 150 (see FIG. 1) and determine if the delay of the variable-delay element (VDE) 220 at the respective clock processor nodes 130A-130N is to be increased or decreased.

Figure 9:
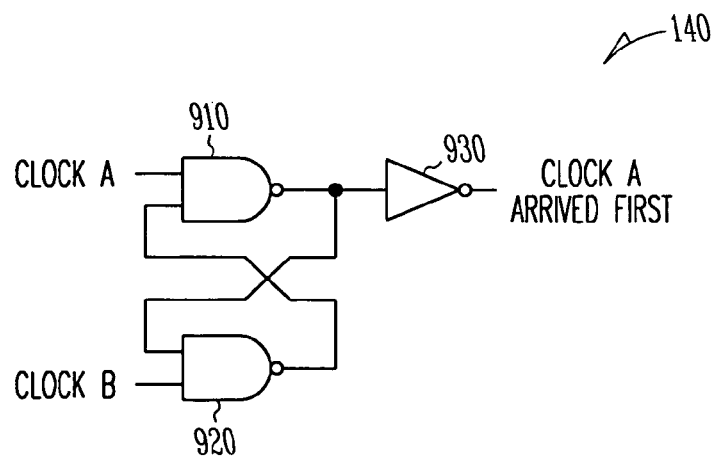
FIG. 9 illustrates a circuit schematic of an example phase detector (PD) according to an example embodiment of the present invention.

FIG. 9 illustrates a circuit schematic of an example phase detector (PD) 140A-140B according to an embodiment of the present invention. Each phase detector (PD) 140A-140B may be a binary phase detector coupled to receive a sequence of clock pulses of a local clock signal "A" from its own local clock region 150A and a sequence of clock pulses of a local clock signal "B" from its neighbor, the local clock region 150B, and to generate a digital output indicating the sign of the phase difference (e.g., phase difference can be positive or negative) between the local clock signal "A" and the local clock signal "B" for subsequent feedback to the variable-delay element (VDE) of the clock processor node 130B for phase adjustments. As shown in FIG. 9, the phase detector (PD) 140A-140B may be implemented by simple logic gates, such as first and second NAND gates 910 and 920, and an inverter 930. The first NAND gate 910 may be coupled to receive a local clock signal "A" and an output of the second NAND gate 920. Similarly, the second NAND gate 920 may be coupled to receive another local clock signal "B" and an output of the first NAND gate 910. The inverter 930 may be used to invert an output of the first NAND gate 910 indicating which one of the local clock "A" or "B" arrives first for subsequent phase adjustments.

Figure 10A:
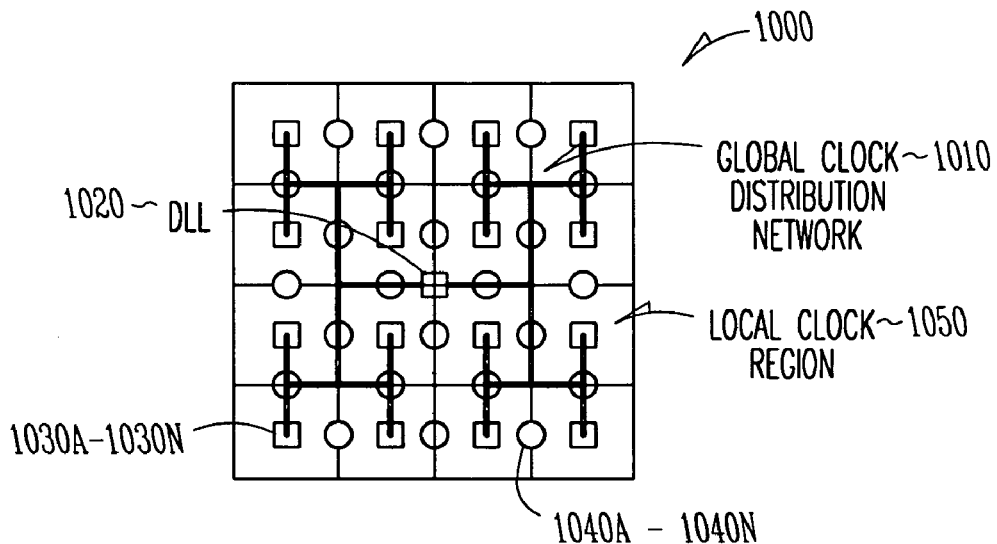
FIGS. 10A-10B illustrate a semi-distributed architecture of an example clock distribution network according to another example embodiment of the present invention.
Figure 10B:
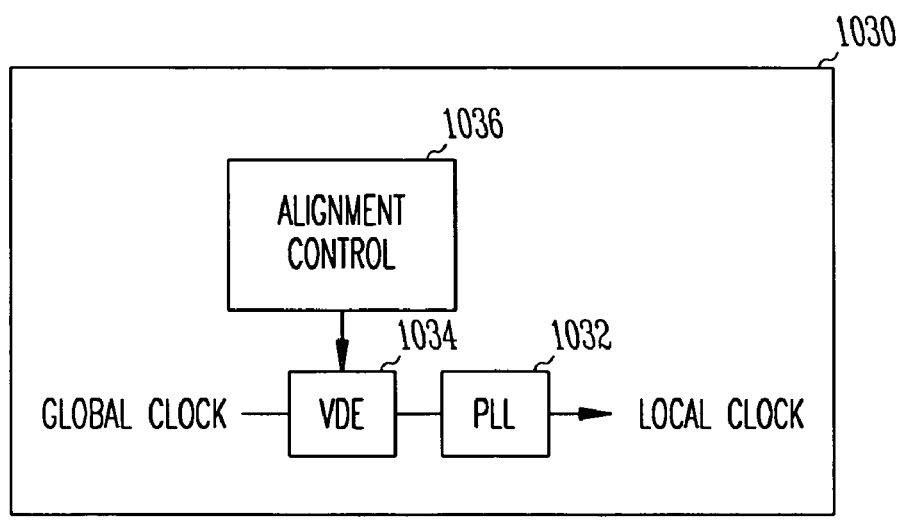

Turning now to FIGS. 10A-10B, a semi-distributed architecture of an example clock distribution network 1000 according to another embodiment of the present invention is illustrated. Similarly to FIG. 1, the semi-distributed architecture 1000 utilizes a global clock distribution network 1010 driven by a single clock synchronizer in a form of a master delay locked loop (DLL) 1020, rather than a master PLL as described with reference to FIGS. 1-3, to feed an array of slave PLLs kept synchronized using variable-delay elements (VDEs) at respective peripheral clock processor nodes 1030A-1030N distributed throughout the area of an IC die.

The master DLL 1020 may be used to generate a "global" clock signal of a lower frequency based on a system clock of a higher frequency and to maintain synchronization between the global clock signal and the system clock. The master DLL 1020 may transport the global clock signal to each slave PLL in the array, via the clock distribution network 1010 at respective peripheral clock processor nodes 1030A-1030N.

Each clock processor node 1030A-1030N may be used to compensate clock "skew" and filter clock "jitter" locally at each local clock region 1050. Each clock processor node 1030A-1030N may also comprise a slave PLL 1032, a variable-delay element 1034 and an alignment control unit 1036 which function in the same way as described with reference to FIGS. 1-3.

Phase detectors (PD) 1040A-1040N may further be arranged between adjacent local clock regions 1050 to ensure that the clock produced by each slave PLL 1032 (i.e., local clock signal) is aligned with the clock of its neighbors. When at least one phase detector (PD) 1040A-1040N determines that the local clock signal at a particular local clock region 1050 may be too fast or too slow, a digital signal may be generated and returned to a corresponding clock processor node 1030A-1030N controlling the particular local clock region 1050 for clock delay adjustment and clock synchronization.

In the multiple PLL design shown in FIG. 1, the master PLL is used to generate a high-frequency core clock for distribution to an array of slave PLLs at peripheral clock processor nodes. In FIGS. 10A-10B, however, the low-frequency core clock obtained from a system clock of the same low-frequency is generated by a master DLL and subsequently distributed to each slave PLL. Then, each slave PLL at each peripheral processor node may generate the high-frequency core clock for its local region. The clock produced by the master DLL can be distributed using on-chip interconnects or in-package interconnects. The advantage of distributing the DLL clock is that its frequency is typically much lower than the frequency of the core clock. Since the frequency of the master DLL clock is lower, distributing the low-frequency master DLL clock requires fewer repeaters. Reducing the number of repeaters reduces jitter which helps make the IC chips such as microprocessors faster.

The semi-distributed architecture of the example clock distribution network 1000 shown in FIGS. 10A-10B has other advantages as well: For example: A different frequency multiplication factor for each local clock region may be used which is useful because the performance-critical regions can have a core clock with a higher frequency. At the same time, other non-critical regions can have a core clock with a lower frequency which helps make the IC chips such as microprocessors faster and cooler, and also cheaper to manufacture.

Figure 11:
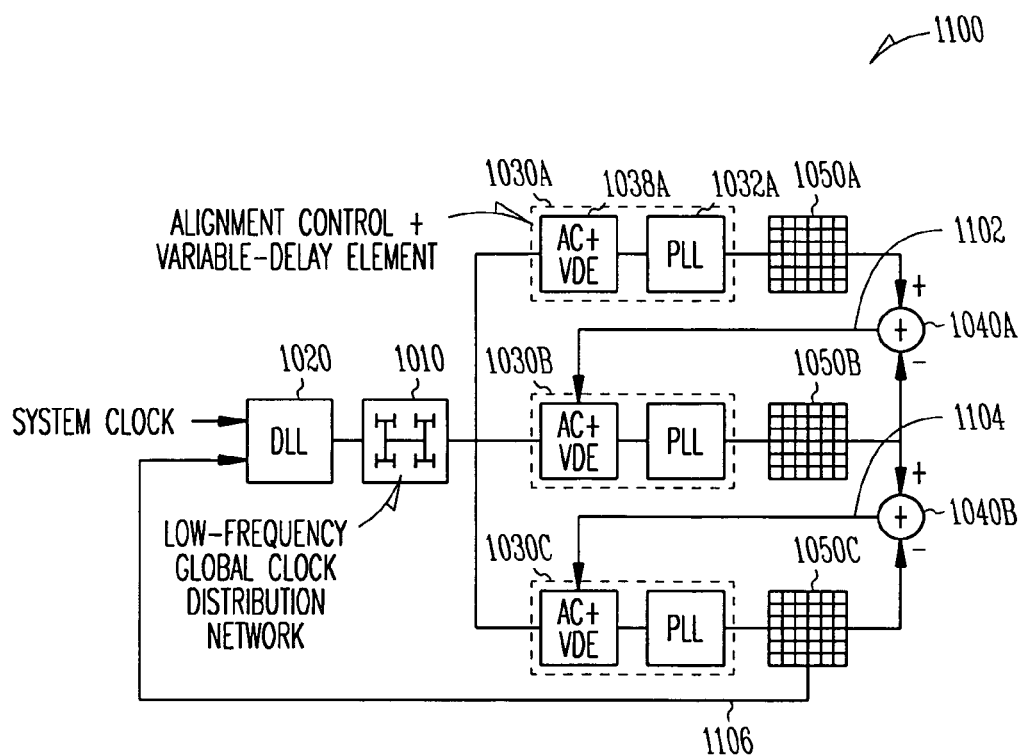
FIG. 11 illustrates an example feedback mechanism for clock skew compensation and jitter filtering of the clock distribution network shown in FIG. 10.

FIG. 11 illustrates an example feedback mechanism 1100 for clock skew compensation and jitter filtering of the clock distribution network shown in FIGS. 10A-10B. Again, for the sake of simplicity, only a selected number of peripheral clock processor nodes and local clock regions are described along with corresponding phase detectors (PD). As shown in FIG. 11, peripheral clock processor nodes 1030A-1030C are coupled to receive the global clock signal from the master DLL 1120 through a low-frequency global clock distribution network 1010 for clock skew compensation and jitter filtering at local clock regions 1050A-1050C. The clock processor node 1030A may include, for example, a slave PLL 1032A arranged to filter the jitter from the global clock signal, and an alignment control/variable-delay element (AC/VDE) 1038A arranged to compensate clock skew from the global clock signal. Similarly, the clock processor node 1030B may include a slave PLL 1032B arranged to filter clock jitter from the global clock signal, and an alignment control/variable-delay element (AC/VDE) 1038B arranged to compensate clock skew from the global clock signal. Likewise, the clock processor node 1030C may include a slave PLL 1032C arranged to filter clock jitter from the global clock signal and generate a local clock signal, and an alignment control/variable-delay element (AC/VDE) 1038C arranged to compensate clock skew from the global clock signal.

Phase detector (PD) 1040A may be coupled to receive the local clock signal "A" from the clock processor node 1030A at the local clock region 1050A and the local clock signal "B" from the clock processor node 1030B at the local clock region 1050B, and generate a digital output indicating the sign of the phase difference (e.g., phase difference can be positive or negative) between the local clock signal "A" and the local clock signal "B" for feedback to the AC/VDE 1038B of the clock processor node 1030B, via feedback line 1102, for phase adjustments. Similarly, a second phase detector (PD) 1040B may be coupled to receive the local clock signal "B" from the clock processor node 1030B at the local clock region 1050B and the local clock signal "C" from the clock processor node 1030C at the local clock region 1050C, and generate a digital output indicating the sign of the phase difference between the local clock signal "B" and the local clock signal "C" for feedback to the AC/VDE 1038C of the clock processor node 1030C, via feedback line 1104, for phase adjustments.

At any local clock region in the entire clock distribution network 1010, for example, the local clock region 1050C as shown in FIG. 11, the local clock signal from the local clock region 1050C may be returned to the master DLL 1020 for the master clock phase alignment, via feedback line 1106.

Figure 12A:
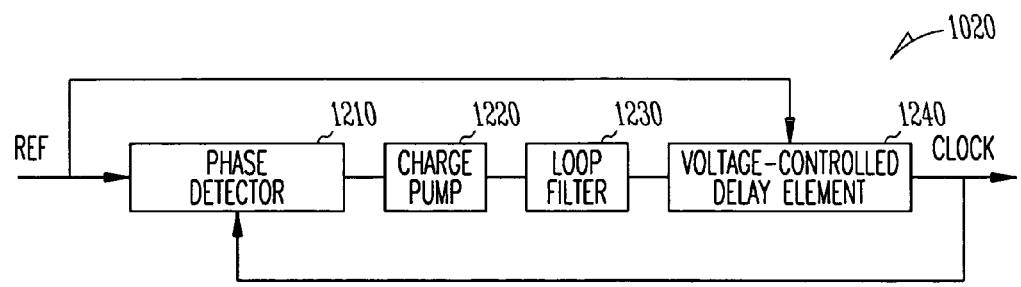
FIGS. 12A-12B illustrate a circuit schematic of an example delay locked-loop (DLL) of the clock distribution network shown in FIG. 10.
Figure 12B:
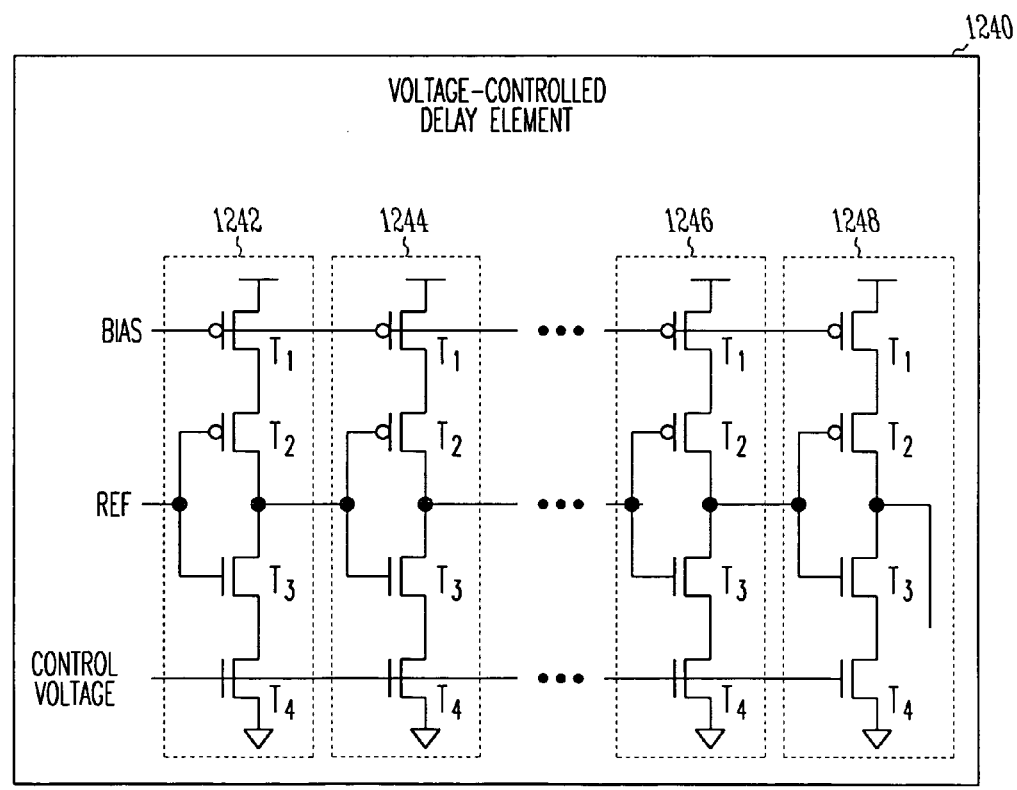

The master (DLL) 1020, as shown in FIGS. 12A-12B, may comprise a phase-frequency detector 1210, a charge pump 1220, a loop filter 1230, a voltage-controlled delay element 1240 for generating a global clock signal which may subsequently be returned, via a feedback loop, from the last local clock region in the entire clock distribution 1010 for phase alignments.

The phase-frequency detector 1210, the loop filter 1220, and the loop filter 1230 may be implemented and function in the same way as described with reference to FIGS. 4-5. Likewise, the slave PLL at each peripheral clock processor nodes 1030A-1030C may be implemented and function in the same way as described with reference to FIGS. 4-8.

The voltage-control delay element 1240 may be implemented using a cascade of current-starved inverters 1242-1248 arranged to generate an output clock that has been phase-corrected and jitter-filtered based on the control voltage. Each of the current-starved inverters 1242-1248 may comprise transistors T1, T2, T3 and T4 arranged in series between a power supply terminal and a ground terminal and coupled to receive the bias voltage and the control voltage to produce the final output clock. In each current-starved inverters 1242-1248, transistors T1 and T2 are p-channel field-effect transistors (P-FETs), and transistors T3 and T4 are n-channel field-effect transistors (N-FETs). Each P-FET T1 has a gate electrode coupled to receive the bias voltage, and each N-FET T4 has a gate electrode coupled to receive the control voltage. The P-FET T2 and N-FET T3 each has a gate electrode connected together in series, and a drain electrode coupled to an output terminal to produce the final output clock.

Figure 13:
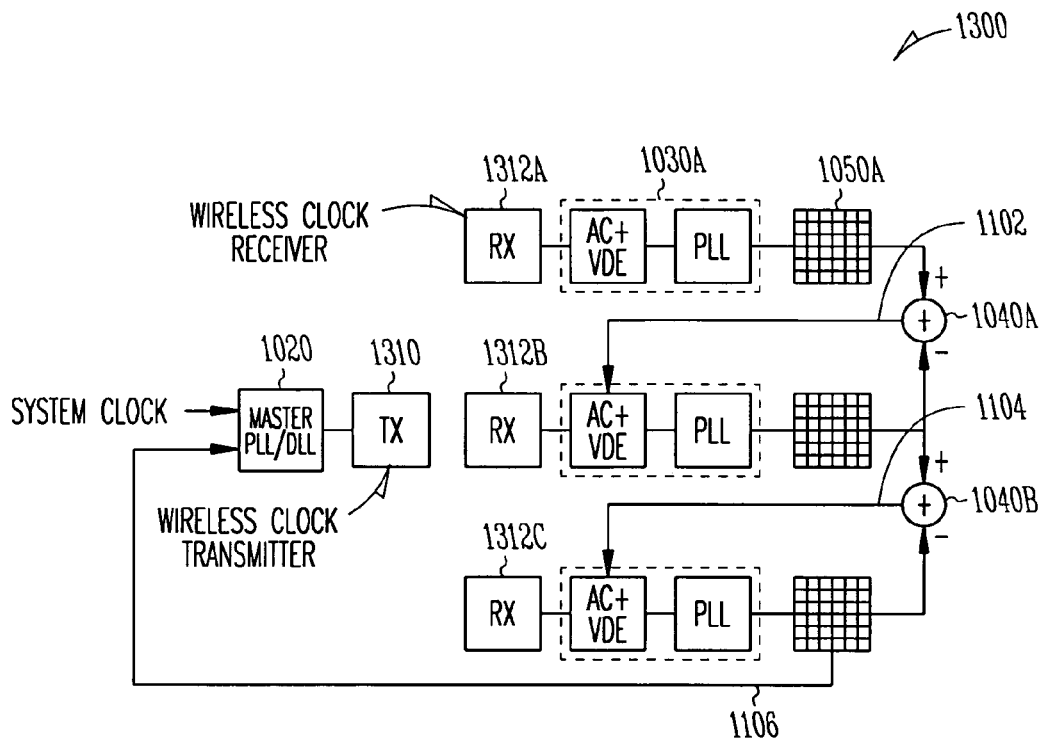
FIG. 13 illustrates an example feedback mechanism for clock skew compensation and jitter filtering of the clock distribution network shown in FIG. 10.

Turning now to FIG. 13, another example feedback mechanism for skew compensation and jitter filtering of the clock distribution network shown in FIG. 1 and FIGS. 10A-10B is illustrated. As shown in FIG. 13, a wireless clock distribution network may be used to replace the conventional clock distribution network as described with reference to FIG. 1 and FIGS. 10A-10B. The wireless clock distribution network may comprise a single wireless clock transmitter 1310 arranged to receive a global clock signal from the master DLL 1020, or alternatively the master PLL 120 (see FIG. 1) and to transmit the same, via radio wave or optical wave; and wireless clock receivers 1312A-1312C coupled to receive the global clock signal from either the master DLL 1020 shown in FIGS. 10A-10B, or the master PLL 120 shown in FIG. 1 at respective peripheral clock processor nodes 1030A-1030C, and to feed the same clock into respective slave PLLs 1032-1032C via variable-delay elements (VDE) for clock skew compensation and jitter filtering. If the wireless clock distribution network is an optical clock distribution network, the wireless clock transmitter 1310 may be an infrared laser configured as an optical clock to generate and emit infrared laser pulses at a desired clock frequency, and the wireless clock receivers 1312A-1312C may be photo-detectors arranged at the respective clock processor nodes 1030A-1030C distributed through different local clock regions 1050A-1050C on the IC chip. Since the slave PLLs at the respective clock processor nodes 1030A-1030C provide local clock signals to clock designated areas of the IC chip, the clock can be optically distributed through the IC chip with minimal clock skew.

Replacing the global clock distribution network in the silicon chip with a radio wave or an optical clock distribution network may offer several potential benefits. For example, the clock skew that typically arises in the global clock distribution network can be minimized as clock frequencies increase. Likewise, the phase jitter that typically arises in the global clock distribution network can also be minimized as wires used to connect the master PLL or DLL to the slave PLLs are eliminated. In addition, the chip area and chip power distribution can be saved since the silicon chip area formerly used for the global distribution is eliminated which will in turn lead to higher manufacturing yields and higher frequency operation resulting from shorter interconnect lengths. Lastly, the clock distribution becomes more scalable to take advantage of developments and radio/optics technology, since the clock distribution is decoupled from the silicon.

FIGS. 14A-14C illustrate an example phase alignment information propagation approach according to an embodiment of the present invention. In order to prevent the slave PLLs from getting caught in an undesirable stable equilibrium at the peripheral clock processor nodes in the clock distribution network as described with reference to FIGS. 1-13, the phase alignment information (i.e., phase error signals) may be propagated from one clock processor node 1030A to another clock processor node 1030B or 1030C distributed throughout the IC chip in a single direction as shown in FIG. 14A, that is, from the top left to the bottom right along the main diagonal of the IC chip until all the slave PLLs at the respective clock processor nodes 1030A-1030N share the same phase. However, any single direction may also be feasible so long as the phase alignment information is propagated along the main diagonal of the IC chip consistently and methodically as shown, for example, in FIGS. 14A-14C.

More specifically, the alignment control unit 1036 at each peripheral clock processor node 1030 may be coupled to the immediate top and left adjacent phase detectors (PDs) 1040A-1040B, but not the immediate bottom and right adjacent phase detectors (PDs). Simple wires can be used to facilitate the coupling between the alignment control unit 1036 of each clock processor node 1030 and its adjacent phase detectors (PDs). A phase averaging mechanism may then be employed by the alignment control unit 1036 to avoid loops in the propagation of the phase alignment information.

Turning now to FIG. 15 and FIG. 16 in which example applications of the clock distribution network according to an embodiment of the present invention are illustrated. In FIG. 15, each of the peripheral clock processor nodes which contains the slave PLL, the variable-delay element (VDE) and the alignment control unit, and distributed throughout the clock distribution network as described with reference to FIGS. 1-14 may correspond to, but not limited to, one of the memory, chipset, logic device and processor in a single computer system. Alternatively, each of the peripheral clock processor nodes may correspond to different areas on a single processor as shown in FIG. 16.

Specifically, FIG. 15 illustrates an example computer system 1500 including an example clock distribution network according to an example embodiment of the present invention. The computer system 1500 may contain an external crystal oscillator 1510 arranged to generate a system clock at line 1520; a single clock generator/synchronizer in the form of a master PLL as described with reference to FIG. 1 or a master DLL as described with reference to FIG. 10 to generate a master clock signal at lines 1504, 1506 and 1508; and a plurality of clock processor nodes distributed throughout the clock distribution network, including, for example, a processor 1530 communicating with other dice including chip set 1532 and memory 1534. Input/output communications among processor 1530, chip set 1532 and memory 1534 may be clocked using the master clock signals from the master PLL/DLL 1520 which are all in phase with each other and are used to drive memory 1534, chip set 1532 and processor 1530, respectively. Each of the processor 1530, the chipset 1532 and the memory 1534 may be provided with its own slave PLL, variable-delay element (VDE) and alignment control for local clock skew compensation and jitter filtering in the manner as described with reference to FIGS. 1-14.

FIG. 16 illustrates an example computer system 1600 including an example clock distribution network according to another embodiment of the present invention. As shown in FIG. 16, the computer system 1600 includes a processor 1600 for performing various computing functions, such as executing specific software to perform specific calculations or tasks. In addition, the computer system 1600 includes one or more input devices 1620, such as a keyboard or a mouse, coupled to the processor 1610 to allow an operator to interface with the computer system 1600. Typically, the computer system 1600 also includes one or more output devices 1630 coupled to the processor 1610, such output devices typically being a printer or a video terminal. One or more data storage devices 1640 are also typically coupled to the processor 1610 to store data or retrieve data from external storage media (not shown). Examples of typical storage devices 1640 include EPROM, EEPROM, and flash devices; magnetic disks (fixed, floppy, and removable); other magnetic media such as tape cassettes; and optical media such as CD-ROM disks. The processor 1610 may contain an example clock distribution network 100 including a master PLL/DLL as shown in FIG. 1 for clock distribution to different regions of the processor 1610, where the slave PLL, the variable-delay element (VDE) and the alignment control unit are arranged to compensate clock skew and filter jitter in the manner as described with reference to FIGS. 1-14.

As described from the foregoing, the present invention advantageously provides a new clock distribution architecture suitable for gigascale integration, and solves the jitter accumulation problem faced by conventional distribution networks without sacrificing compatibility with established DFT and DFD techniques. Because the network uses digital instead of analog feedback, the synchronization mechanism for the PLLs can be flexible and more robust, while maintaining stability. The skew compensation mechanism can compensate the following variations: (1) fabrication variations in the global clock distribution network; (2) fabrication variations in the slave PLLs; and (3) fabrication variations in the local clock regions.

While there have been illustrated and described what are considered to be example embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. For example, the PLL and DLL can be implemented for both digital and analog applications using different arrangements of a feedback circuit. Alternatively, the master PLL, as shown in FIG. 1, and the master DLL, as shown in FIG. 10, can be replaced by a single system clock distribution pin. In this implementation, there may be no master PLL or master DLL. The system clock can be directly distributed from the system clock pin to the array of slave PLLs at the peripheral clock processor nodes, via on-chip interconnects or in-package interconnects of the global clock distribution network. Other circuit elements of the clock distribution network such as the phase-frequency detector, the charge-pump, the loop filter, and the voltage-controlled oscillator or voltage-controlled delay element can be implemented with different types of transistors and logic gates, such as AND, NAND, OR and XOR gates. Likewise, the variable-delay element (VDE) can also be implemented using different combinations of transistors as long as the transistors can serve as a variable delay mechanism. Therefore, it is intended that the present invention not be limited to the various example embodiments disclosed, but that the present invention includes all embodiments falling within the scope of the appended claims.

What is claimed is:

1. An architecture for clock distribution on an integrated circuit (IC), comprising:
    a clock distribution network;
    a plurality of clock processor nodes distributed throughout the clock distribution network on the IC at respective local clock regions;
    a master clock generator to generate a master clock for distribution to the clock processor nodes, via the clock distribution network, to compensate clock skew and filter clock jitter locally at the respective local clock regions; and wherein:
the master clock generator corresponds to a master delay locked loop (DLL) to generate and keep the master clock synchronized responsive to a system clock; and
each clock processor node at each local clock region comprises:
a slave phase-locked loop (PLL) to generate a high-frequency core clock for its local region and to attenuate the clock jitter from the master clock introduced by the clock distribution network; and
a variable-delay element (VDE) to compensate the clock skew from the master clock introduced by the clock distribution network.

2. An architecture as claimed in claim 1, wherein the master delay-locked loop (DLL) comprises:
a phase detector to compare the frequency of the system clock and the frequency of the master clock that has been fed back, and to produce an output that is proportional to the phase difference of the system clock and the master clock;
a charge pump to compensate for any undesired delay variation experienced by the master clock;
a loop filter to filter the clock jitter from the master clock; and
a voltage-controlled delay element to generate a final master clock that has been phase-corrected and jitter-filtered.

3. An architecture as claimed in claim 2, wherein the voltage-controlled delay element comprises a cascade of current-starved inverters to generate the final master clock that has been phase-corrected and jitter-filtered responsive to the control voltage, and wherein each of the current-starved inverters comprises a plurality of transistors in series between a power supply terminal and a ground terminal and to receive a bias voltage and the control voltage to produce the final master clock.

4. An architecture as claimed in claim 1, wherein the clock distribution network corresponds to an equal length H-tree clock distribution network in which the master clock generated from the master DLL is routed to each of the clock processor nodes of an equal distance from the master DLL, via intermediate nodes of an equal distance from the master DLL.

5. An architecture as claimed in claim 1, wherein the variable-delay element comprises an inverter and a digitally adjustable resistor having a set of resistance values supporting a range of delay variations.

6. An architecture as claimed in claim 1, wherein each clock processor node at each local clock region comprises an alignment control unit to control delay variations of the variable-delay element (VDE) so as to align the master clock for clock skew compensation.

7. An architecture as claimed in claim 6, further comprising phase detectors arranged between adjacent local clock regions to ensure that a local clock generated by the slave PLL is aligned with the local clock of its neighbors, and when the local clock generated by the slave PLL is faster or slower relative to the local clock of its neighbors, at least one phase detector generates a digital signal for feedback to the corresponding clock processor node for clock delay adjustment and clock synchronization.

8. An architecture as claimed in claim 1, wherein each slave PLL comprises:
a first divider to receive the master clock and to produce a divided clock;
a phase-frequency detector to compare the frequency of the divided clock and the frequency of the local clock that has been fed back, via a second divider, and to produce an output that is proportional to the phase difference of the master clock and the local clock;
a charge pump to compensate for any undesired delay variation experienced by the local clock;
a loop filter to filter the clock jitter from the local clock; and
a voltage-controlled oscillator (VCO) to generate a final local clock that has been phase-corrected and jitter-filtered.

9. A system, comprising:
a master clock generator to generate a master clock for distribution;
an external crystal oscillator coupled to the master clock generator to generate a system clock used by the master clock generator; and
a plurality of clock processor nodes, each clock processor node including:
a slave phase-locked loop (PLL) to attenuate clock jitter from the master clock introduced by a clock distribution network;
a variable-delay element (VDE) to compensate clock skew from the master clock introduced by the clock distribution network; and
an alignment control unit to control delay variations of the variable-delay element (VDE) so as to align the master clock for clock skew compensation.

10. A system as claimed in claim 9, wherein the master clock generator is a master phase-locked loop (PLL) or a master delay locked loop (DLL).

11. A system as claimed in claim 9, wherein said clock processor nodes include:
a memory coupled to the master clock generator to receive the master clock;
a chip set coupled to the master clock generator to receive the master clock; and
a processor coupled to the master clock generator to receive the master clock, the processor also being coupled to the memory and the chip set.

* * * * *